United States Patent [19]

Onoguchi et al.

[11] 4,420,686
[45] Dec. 13, 1983

[54] SCANNING ELECTRON MICROSCOPE OR SIMILAR EQUIPMENT CAPABLE OF DISPLAYING SIMULTANEOUSLY A PLURALITY OF IMAGES OF SPECIMEN

[75] Inventors: Akira Onoguchi, Chofu; Mitsuhisa Miyazawa, Sagamihara; Shigetomo Yamazaki, Hachioji; Masahiro Inoue, Kawasaki, all of Japan

[73] Assignee: Kabushiki Kaisha Akashi Seisakusho, Tokyo, Japan

[21] Appl. No.: 327,163

[22] Filed: Dec. 3, 1981

[30] Foreign Application Priority Data

Jan. 29, 1981 [JP] Japan .................................. 56-11810

[51] Int. Cl.³ .................... G01N 23/00; G21K 7/00
[52] U.S. Cl. .................................. 250/310; 250/311
[58] Field of Search ...................... 250/310, 306, 311

[56] References Cited

U.S. PATENT DOCUMENTS 4,039,829 8/1977 Kato et al. .......................... 250/306

FOREIGN PATENT DOCUMENTS

1315945 5/1973 United Kingdom ................ 250/310

Primary Examiner—Alfred E. Smith
Assistant Examiner—T. N. Grigsby
Attorney, Agent, or Firm—Robert E. Burns; Emmanuel J. Lobato; Bruce L. Adams

[57] ABSTRACT

The specification describes a scanning electron microscope or similar equipment capable of irradiating a plurality of beams of charged particles onto a specimen and displaying simultaneously the plurality of images of the specimen. It comprises charged particle beam modulation means to modulate the intensities of the beams of charged particles through their deflection by different frequencies, a detector capable of detecting secondary electrons or the like given off from the specimen, demodulation selector means capable of demodulating signals from the detector and selecting each specimen image signal, and display means capable of displaying the plurality of images of the specimen. The plurality of beams may be irradiated in parallel onto different spots on the specimen or may be directed to one specific spot on the specimen. Thus, a plurality of specimen images can be displayed extremely efficiently and, also, simultaneously by simple means.

7 Claims, 19 Drawing Figures

SCANNING ELECTRON MICROSCOPE OR SIMILAR EQUIPMENT CAPABLE OF DISPLAYING SIMULTANEOUSLY A PLURALITY OF IMAGES OF SPECIMEN

BACKGROUND OF THE INVENTION (1) Field of the Invention

This invention relates to a scanning electron microscope or similar equipment, and more particularly to a scanning electron microscope or similar equipment capable of irradiating a plurality of beams of charged particles onto a specimen and displaying simultaneously the plurality of images of the specimen.

(2) Description of the Prior Art

There have heretofore been known a wide variety of scanning electron microscopes and similar equipment. For example, there is a scanning electron microscope as shown in FIG. 1, in which an electron beam emitted from an electron gun b in a microscope column a is imparted with a scanning movement by a deflection coil d, to which a scanning signal has already been fed from a scanning power supply c, whereby causing the electron beam to irradiate a specimen e while scanning same.

As the electron beams scans the specimen e, secondary electrons or the like are given off from the specimen e and detected by a detector f. Then, a resulting detection signal is amplified by an amplifier g and subsequently fed to a Braun tube (Cathode-ray tube) h, where an image of the specimen is displayed.

Figure 1:
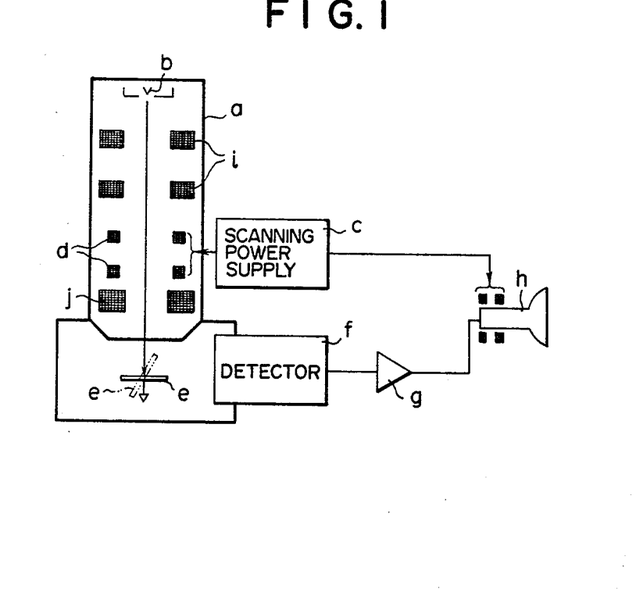
FIG. 1 is a simplified block diagram of a prior art scanning electron microscope.

In FIG. 1, letters i and j indicate a condenser lens and objective lens respectively.

When observing an IC pattern formed on a silicon wafer by using such a scanning electron microscope, it is necessary in some instances to observe the specimen e at varied angles. In another instance, it may be desirous to observe the specimen e in this manner.

However, with a conventional scanning electron microscope as illustrated in FIG. 1, there are problems such that it takes some time for inclining the specimen e and, in addition, it is rather difficult to find out the same field of vision after the specimen e has been inclined. Such a conventional scanning electron microscope is also accompanied by another problem that it is incapable of obtaining at the same time a plurality of images of the specimen e seen at varied angles.

SUMMARY OF THE INVENTION

The present invention has been completed to solve the above-described problems which prior art scanning microscopes and similar equipment have encountered. Accordingly, an object of this invention is to provide a scanning electron microscope or similar equipment which can efficiently display a plurality of specimen images at the same time by simple means.

In one aspect of this invention, there is thus provided a scanning electron microscope or similar equipment capable of irradiating a plurality of beams of charged particles onto a specimen and displaying simultaneously the plurality of images of the specimen. It comprises charged particle beam modulation means capable of modulating the intensities of said beams of charged particles through the deflection of said beams by different frequencies, a detector capable of simultaneously detecting signals obtained by irradiating onto the specimen the plurality of beams of charged particles which have been modulated by the charged particle beam modulation means, demodulation selector means capable of demodulating signals from said detector and selecting each specimen image signal from the plurality of pieces of specimen image information obtained by said beams of charged particles, and display means capable of displaying the plurality of images of the specimen upon receipt of signals from said demodulation selector means.

BRIEF DESCRIPTION OF THE DRAWINGS

In order that the invention may be clearly understood and readily carried into effect, some preferred embodiments thereof will now be described, by way of example only, with reference to the accompanying drawings of which:

FIGS. 17 and 18 depict other embodiments of the display means, in which FIG. 17 is a block diagram of the display means while

DETAILED DESCRIPTION OF THE PREFERRED EMBODIMENTS

Figure 2:
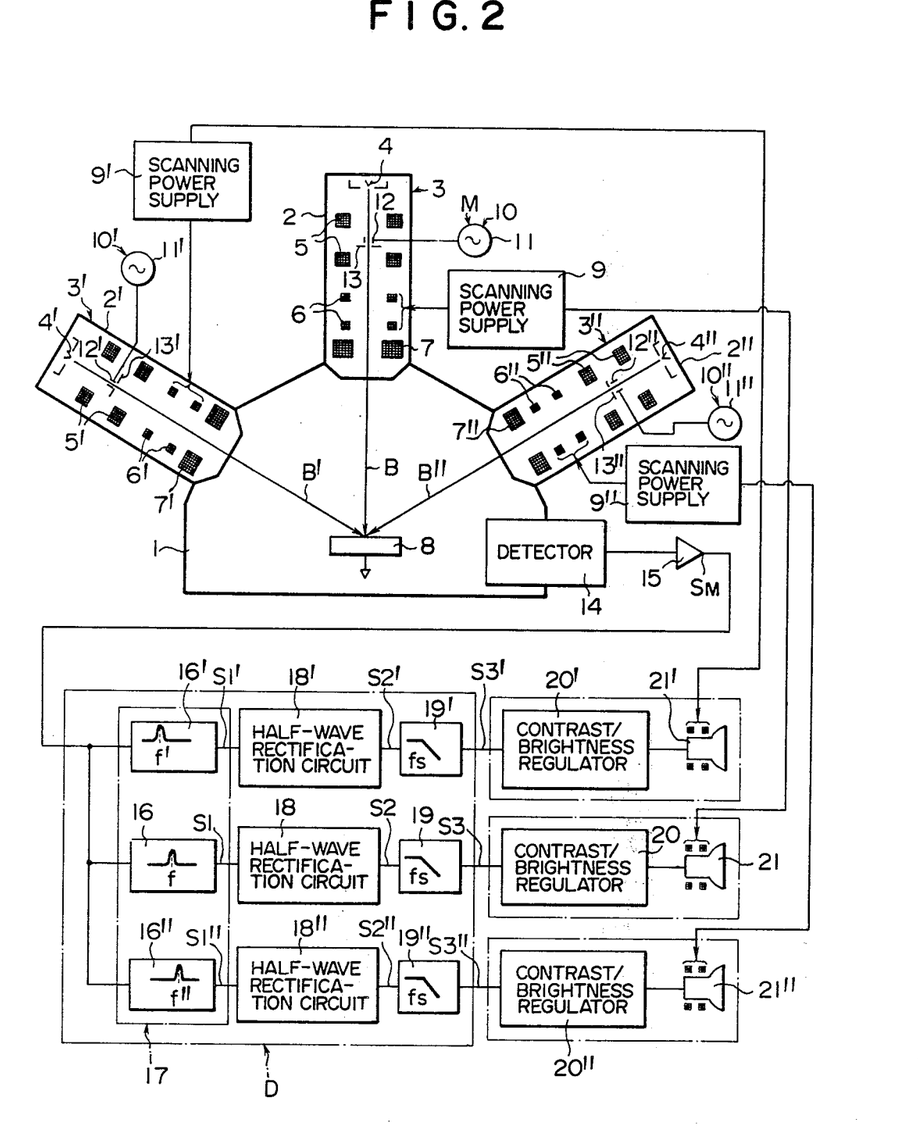
FIG. 2 depicts a simplified block diagram of the scanning electron microscope according to one embodiment of this invention.
Figure 3:
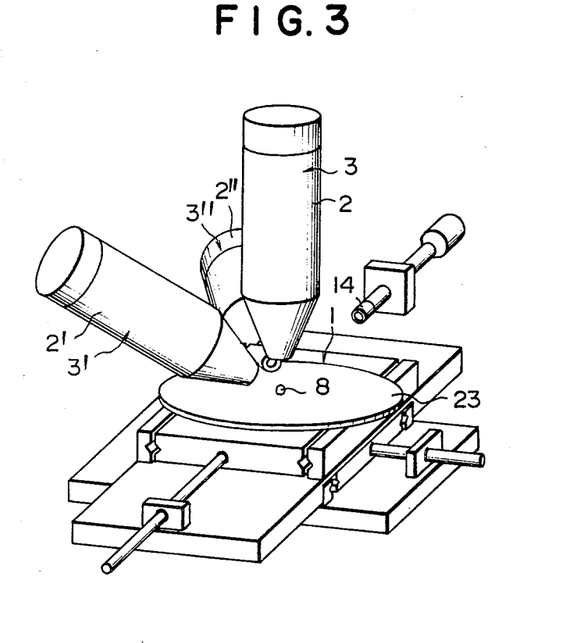
FIG. 3 is a perspective view showing an arrangement of charged particle beam irradiation systems of the scanning electron microscope shown in FIG. 2.

As shown in FIGS. 2 and 3, at an upper portion of a specimen chamber 1, there are provided as charged particle beam irradiation systems three electron beam irradiation systems 3, 3', 3" housed in microscope columns 2, 2', 2" with an angular interval of 60° in such directions that their beam axes interest at one point.

The electron beam irradiation systems 3, 3', 3" are respectively constructed by electron guns 4, 4', 4", condenser lens 5, 5', 5", deflection coils 6, 6', 6", objective lens 7, 7', 7", etc., all housed in their respective microscope columns 2, 2', 2". Each of the deflections coils 6, 6', 6" is formed of two deflection coils, one for deflection in X-direction and the other in Y-direction.

Owing to the fact that the three electron beam irradiation systems 3, 3', 3" are disposed with an angular spacing of 60° therebetween so as to cause their electron beams intersect, electron beams B, B', B" can be irradiated in mutually-crossing directions from their respective electron beam irradiation systems onto the same surface spot on a specimen 8.

The deflection coils 6, 6', 6" are fed with sawtooth wave-shaped scan signals for scanning in X- and Y-directions from their corresponding scanning power supplies 9, 9', 9", whereby causing their respective electron beams to scan the specimen 8.

Furthermore, the scanning electron microscope is also provided with an electron beam modulation means M as the charged particle modulation means, which electron beam modulation means M can deflect the electron beams B, B', B" by different frequencies f, f', f" to modulate the intensities of the electron beams. This electron beam modulation means M comprises three electron beam modulators 10, 10', 10" as charged particle beam modulators, provided respectively with the electron beam irradiation systems 3, 3', 3".

The electron beam modulators 10, 10', 10" comprise respectively of oscillators 11, 11', 11" capable of generating A.C. signals of the frequencies f, f', f", electrostatic deflection members 12, 12', 12" coupled with their respective oscillators 11, 11', 11" and capable of deflecting the electron beams B, B', B" and beam limiting members (window members) 13, 13', 13" provided below the deflection members 12, 12', 12" for limiting quantity of the electron beams B, B', B". As described above, the frequencies f, f', f" are different from one another.

The deflection members 12, 12', 12" and beam limiting members 13, 13', 13" are arranged between their respective condenser lens 5, 5', 5". In addition, the deflection members 12, 12', 12" are located below the cross-over points P, P', P" of their corresponding upper condenser lens 5, 5', 5" (See, FIG. 4).

Figure 4:
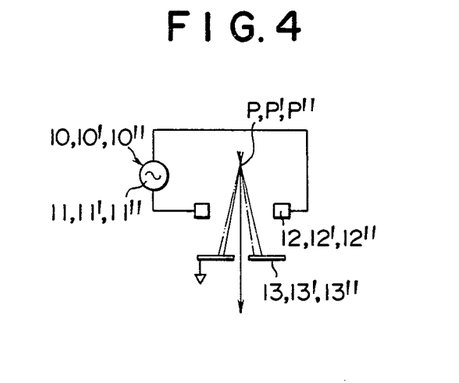
FIG. 4 is a schematic illustration of its modulation means for charged particle beams.

The beam limiting members 13, 13', 13" define a slit and grounded (See, also FIG. 4).

Figure 5:
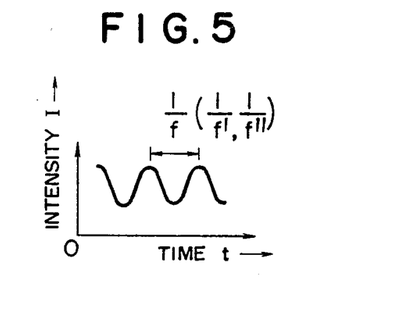
FIG. 5 is a diagrammatic illustration of a wave shape for explaining the function of the modulation means for charged particle beams.

Accordingly, by deflecting the electron beams B, B', B" by the different frequencies f, f', f" at the electron beam modulators 10, 10', 10" respectively, it is possible to modulate the intensities of the electron beams output from the beam limiting members 13, 13', 13" by the frequencies f, f', f" as depicted in FIG. 5.

Each of the frequencies f, f', f" is set at a value at least equal to, preferably, greater than a frequency twice the frequency $f_s$ obtained as a function of a frequency $f_x$ of a sawtooth wave-shaped X-direction (namely, the horizontal direction) scan signal—the frequency $f_x$ of the above signal is higher than a frequency $f_y$ of a sawtooth wave-shaped Y-direction (namely, the vertical direction) scan signal—and a resolution A required on the Braun tube. Said frequency twice the frequency $f_s$ is minimum frequency leaded by sampling theorem.

By the way, a detector 14 is provided in a wall portion of the specimen chamber 1. The detector 12 detects simultaneously secondary electrons, reflected electrons, specimen current, etc. which occur concurrently from the specimen 8 when the specimen 8 is irradiated at the same time by the three electron beams B, B', B" modulated at their respective modulators 10, 10', 10".

As the detector 14, a scintillation detector may for example be used. A consideration is made so as to avoid saturation of the detector 14 even when the intensities of the detection signals become great through a simultaneous irradiation of the three electron beams B, B', B" onto the specimen 8.

Figure 13:
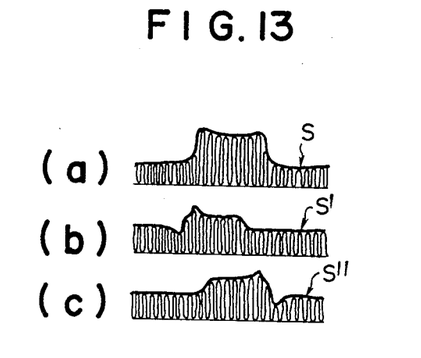
FIGS. 13 through 16 are each a wave shape diagram for explaining the function of demodulation selector means.

Thus, signals detected at the detector 14 and amplified at an amplifier 15 take the form of a composite signal $S_M$ obtained by putting signals S, S', S" as shown in FIGS. 13(a), 13(b), and 13(c) together.

Here, the signal S shown in FIG. 13(a) is a signal containing specimen image information seen from a point right above the specimen and modulation in amplitude by the frequency f. The signal S' illustrated in FIG. 13(b) is a signal containing specimen image signal viewed from an upper oblique point and modulated in amplitude by the frequency f', while the signal S" is a signal containing specimen image information seen from another upper oblique point and modulated in amplitude by the frequency f". The signal S" is shown diagrammatically in FIG. 13(c).

The composite signal $S_M$ detected at the detector 14 and amplified at the amplifier 15 is then demodulated by the demodulation selector means D, whereby selectively obtaining three kinds of specimen image information corresponding to the electron beams B, B', B".

Figure 14:
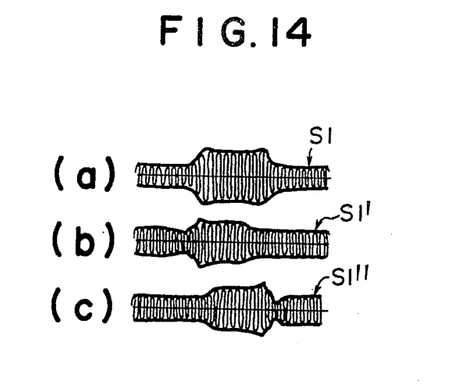
Figure 15:
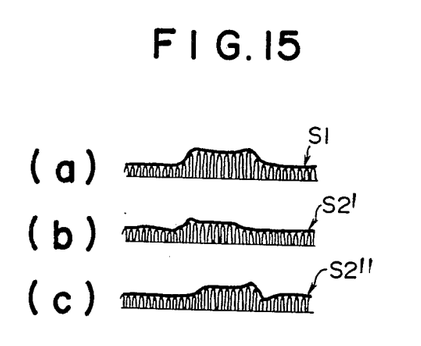
Figure 16:
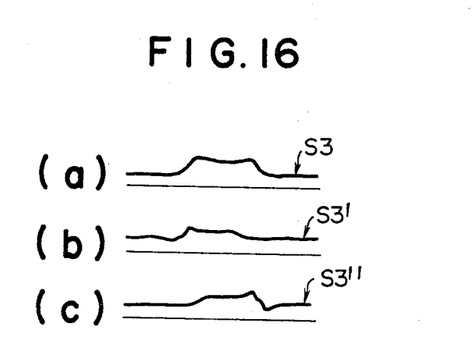

Namely, the demodulation selector means D is constituted by a filter bank 17 comprising three band-pass filters 16, 16', 16" which are connected in parallel, half-wave rectification circuits 18, 18', 18" adapted to rectify signals $S_1$, $S'_1$, $S''_2$ from the band-pass filters 16, 16', 16" into half-waves (See, FIGS. 14(a), 14(b) and 14(c)) and to output as signals $S_2$, $S'_2$, $S''_2$ shown in FIGS. 15(a), 15(b) and 15(c) respectively, and low-pass filters 19, 19', 19" adapted to detect only the enclosure components with respect to the signals $S_2$, $S'_2$, $S''_2$ from the half-wave rectification circuits 18, 18', 18" and output as signals $S_3$, $S'_3$, $S''_3$ shown in FIGS. 16(a), 16(b), and 16(c).

Figure 6:
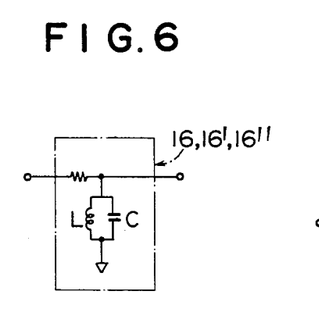
FIGS. 6 and 7 are each an electric circuit diagram of a band-pass filter in the demodulation selector means.

Each of the band-pass filters 16, 16', 16" is connected at its input side with the amplifier 15. They are constructed as filters having as their center frequencies the frequencies f, f', f" used to modulate the electron beams B, B', B" respectively. As such a band-pass filter, there may be employed for instance a passive-type band-pass filter made of a coil L and condenser C as illustrated in FIG. 6.

Inductance of the coil L and conductance of the condenser C are selected to satisfy the following equation:

$$f(f, f') = \frac{1}{2\pi \sqrt{LC}}$$

Thus, the values of the coil and condenser in each of the band-pass filters 16, 16', 16" are suitably varied.

Figure 7:
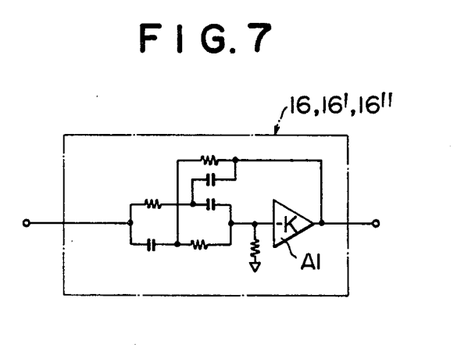

As the band-pass filters 16, 16', 16", it is possible to use active-type band-pass filters each consisting of an operational amplifier A1 or the like as shown in FIG. 7. Needless to say, the value of each of the resistors and capacitors must be suitably determined depending on the central frequency.

Figure 8:
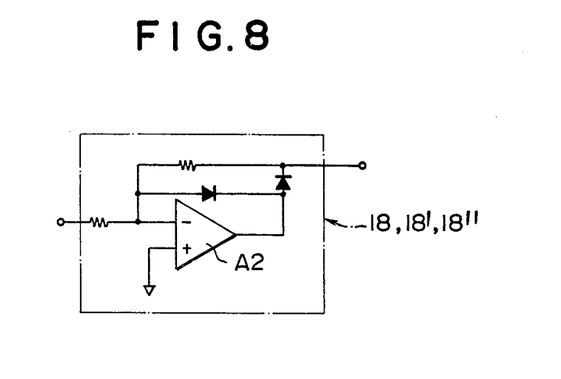
FIGS. 8 and 9 are each an electric circuit diagram of a rectification circuit in the demodulation selector means.
Figure 9:
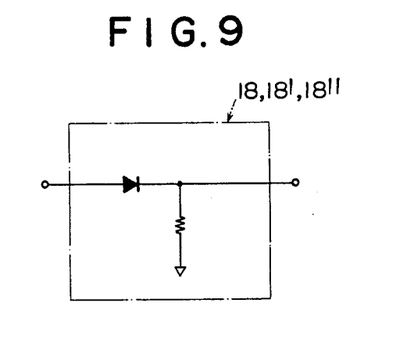

On the other hand, as the half-wave rectification circuits 18, 18', 18", active-type rectification circuits employing as shown in FIG. 8 an operational amplifier A2 or the like is used. Alternatively, as the half-wave rectification circuits 18, 18', 18", it is also possible to employ passive-type rectification circuits as illustrated in FIG. 9.

Figure 10:
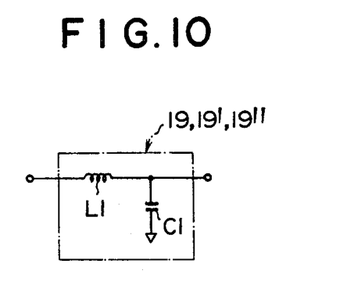
FIGS. 10 and 11 are each an electric circuit diagram of a low-pass filter in the demodulation selector means.

Furthermore, as the low-pass filters 19, 19', 19", passive-type filters, each, consisting of a coil $L_1$ and condenser $C_1$ as shown in FIG. 10 is used. The cut-off frequency of each of the low-pass filters 19, 19', 19" is equal to the above-mentioned frequency $f_s(=A\cdot f_x)$ and its gain characteristic is illustrated in FIG. 12.

Figure 12:
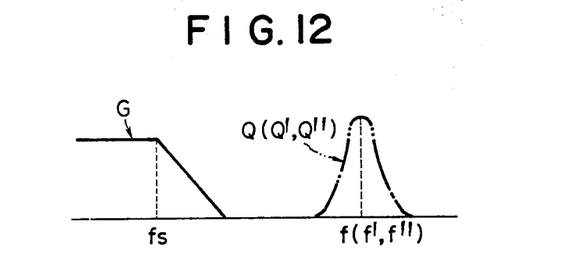
FIG. 12 is an explanatory diagram showing the gain characteristics of the low-pass filter and band-pass filter.

Therefore, the gain characteristics G of the low-pass filters 19, 19', 19" are located in the lower frequency regions than the Q-characteristics of their respective band-pass filters 16, 16', 16" which have central frequencies f, f', f" respectively so that the gain characteristics G would not overlap with the Q-characteristics (See, FIG. 12). Owing to such features, the low-pass filters 19, 19', 19" can detect only the enclosure components of the signals $S_2$, $S'_2$, $S''_2$ by removing the high frequency modulation components f, f', f" and can output the thus-detected enclosure components as signals $S_3$, $S'_3$, $S''_3$.

Figure 11:
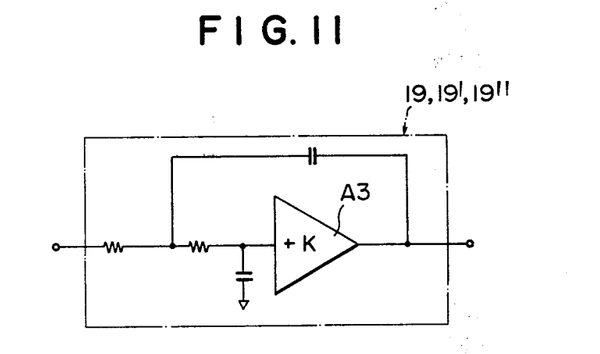

The low-pass filters 19, 19', 19" may be of the active type employing an operational amplifier 3A or the like as shown in FIG. 11. The attenuation characteristic of each of the low-pass filters 19, 19', 19" may be of either primary or secondary type.

As has been described above, it is possible to use either passive or active type as the band-pass filters 16, 16', 16", the half-wave rectification circuits 18, 18', 18" and the low-pass filters 19, 19', 19". When passive-type band-pass filters and passive-type low-pass filters as well as active-type half-wave rectification circuits are employed, the half-wave rectification circuits function as buffers, thus improving the performance of the demodulation selector means D without providing a buffer additionally.

The low-pass filters 19, 19', 19" are connected to Braun tubes 21, 21', 21", as display means, through their respective contrast and brightness regulators 20, 20', 20". To the deflection yokes of the Braun tubes 21, 21', 21", are fed sawtooth wave signals for Braun tube scanning, which are in synchronization with the sawtooth wave scan signals to be fed to the deflection coils 6, 6', 6", from their corresponding scanning power supplies 9, 9', 9".

Thus, by means of the Braun tubes 21, 21', 21" fed with signals $S_3$, $S'_3$, $S''_3$ (See, FIGS. 16(a), 16(b) and 16(c)) from the demodulation selector means D, the specimen images, one seen from a point right above the specimen, the other two viewed at differenct angles from two different points upper right or left of the specimen, can be displayed simultaneously.

To simultaneously obtain the specimen images seen at three different angles with respect to the specimen 8 by means of the above-described scanning electron microscope, the specimen 8 is first placed on a specimen stage 23 in the specimen chamber 1 and the electron beams B, B', B" are irradiated simultaneously in different directions from the three electron beam irradiation systems 3, 3', 3".

Here, the intensities of the electron beams B, B', B" have already been modulated by the differenct frequencies f, f', f".

By irradiating the electron beams B, B', b" simultaneously onto the same specimen 8, secondary electrons and the like are given off from the specimen 8 and are then detected at the detector 14.

The signal detected at the detector 14 and containing three kinds of specimen image information in a mixed state is amplified by the amplifier 15 and then demodulated by the demodulation selector means D. The thus-selected signals $S_3$, $s'_3$, $S''_3$ are then subjected to both contrast and brightness adjustments at their respective contrast and brightness regulators 20, 20', 20" and then supplied to their corresponding Braun tubes 21, 21', 21", where the sample images are simultaneously displayed.

Since three specimen images can be simultaneously displayed on the three Braun tubes 2, 21', 21" without inclining the specimen 8, an observation and measurement work of, for example, line widths or the like of an IC pattern formed on the specimen 8 can be carried out easily and accurately.

The electron beam irradiation systems 3, 3', 3" are arranged with an angular interval of 60°. However, the installation spacing of these electron beam irradiation systems may be anything as far as they can irradiate the same spot on the specimen 8. Specifically speaking, it may vary within an angular range of from 45° to 70°.

Figure 17:
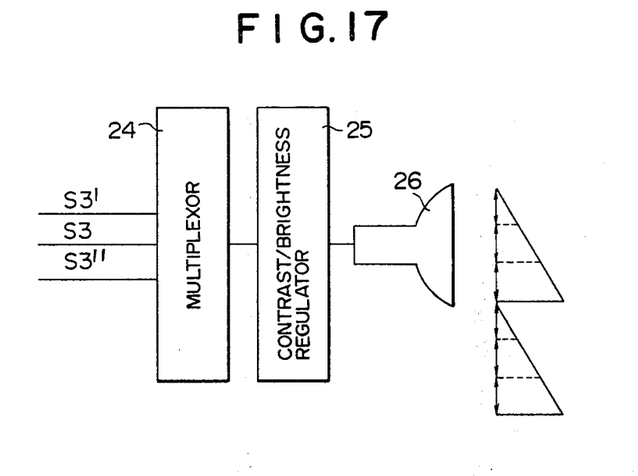

In stead of using a plurality of, namely, three Braun tubes 21, 21', 21" as display means, it may be possible to use in combination a multiplexor 24 as a change-over switch for receiving signals $S_3$, $S'_3$, $S''_3$ pertaining specimen image information from the demodulation selector means D and a single Braun tube 26 connected to the multiplexor 24 through a contrast and brightness regulator 25.

Figure 18:
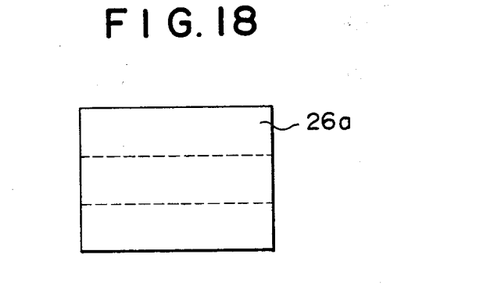
FIG. 18 is a schematic illustration of the display plate of the Braun tube.

Here, the multiplexor 24 is a switch, which receives the signals $S_3$, $S'_3$, $S''_3$ and sequentially outputs them by switching from one signal to another, for example, at an period of one thirds of the sawtooth wave-shaped vertical scan signal for the Braun tube 26, whereby obtaining a specimen image corresponding to the signal $S'_3$ at the upper ⅓ portion of the picture plane of the screen 26a of the Braun tube 26, another specimen image corresponding to the signal $S_3$ at the central ⅓ portion of the same picture plane and a further specimen image corresponding to the signal $S''_3$ at the lower ⅓ portion of the same picture plane (See, FIG. 18).

Owing to the adoption of such display means as described just above, three kinds of specimen images can be displayed simultaneously on the screen 26a of the single Braun tube 26.

Furthermore, the low-pass filters 19, 19', 19" may be connected to memories, whereby displaying specimen images on the Braun tubes 21, 21', 21" on the basis of information of the specimen images stored in the memories.

In stead of the half-wave rectification circuits 18, 18', 18", it is also possible to employ full-wave rectification circuits as the rectification circuits.

Figure 19:
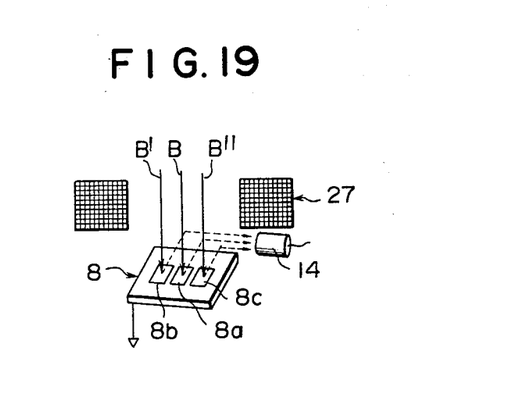
FIG. 19 is a schematic illustration for explaining the operation of the scanning electron microscope according to another embodiment of this invention, which can display a plurality of specimen images simultaneously.

In FIG. 19, numerals and letters indicate substantially the same parts or members as indicated by the like numerals and letters in FIGS. 2 through 18.

In the embodiment illustrated in FIG. 19, for example, three electron beam irradiation systems as charged particle beam irradiation systems are disposed with their beam axes extending in parallel to one another so as to direct the three electron beams B, B', B" parallely onto three different points 8a, 8b, 8c on the specimen 8. As a specific example of an objective lens 27, there is employed a composite electronic lens capable of generating three electron beams B, B', B".

The term "composite electronic lens" as used herein means an electronic lens provided with a plurality (in the illustrated embodiment, three) of apertures for the passage of electron beams in at least one of the facing magnetic polar surfaces and capable of generating the plurality of, namely, three electron beams B, B', B" to be irradiated onto the specimen.

It is the same as in the above embodiment that the electron beams B, B', B" are respectively modulated by the different frequencies f, f', f'' owing to the provision of the electron beam modulation means M.

Thus, in this embodiment, three pieces of information on specimen images of different spots 8a, 8b, 8c of the specimen 8 are also detected together at the detector 14. Then, they are demodulated and selected separately by the demodulation selector means D and subsequently displayed as images of the spot 8a, 8b, 8c of the specimen 8 by means of three Braun tubes 21, 21', 21'' or the single Braun tube 25. Thus, this embodiment brings about substantially the same effects and merits as the above embodiment.

In stead of using the composite electronic lens to obtain the mutually-parallel plural (namely, three) electron beams B, B', B'' it is of course feasible to dispose three electron beam irradiation systems housed separately in their respective microscope columns in parallel to one another.

Although the above embodiments employ three electron beam irradiation systems, two or four or more electron beam irradiation systems may be provided as needed, whereby irradiating two or four or more electron beams onto the specimen. Needless to say, the number of band-pass filters, half-wave rectification circuits, low-pass filters, etc. should be increased or decreased in accordance with the number of electron beams employed.

In addition, it is also possible to provide two or more detectors in each of the above-described embodiments. In this case, signals from the detectors are first added at an adder and then, either through the amplifier 15 or directly, input to the demodulation selector means D for processing.

Where a plurality of detectors are provided as mentioined above, it is preferable to use those capable of detecting reflected electrons. It is desirous to arrange the detectors symmetrically or with an equal interval.

Beside inputting a plurality of pieces of information of specimen images on the same surface spot of a specimen to their respective Braun tubes, each piece of specimen image information may be processed with weight suitably. Thereafter, resulting signals may be put together and input to a single Braun tube. This permits to observe a steroscopic specimen image too. The weighting process of the specimen image information is carried out to correct any errors resulted from a deviation of its respective electron beam as it is rather difficult to direct all the electron beams onto a specific point on the same specimen.

The demodulation selector means D and amplifier 15 may be formed together into an IC. The demodulation selector means D may be constructed into either an analogue type or digital type. As the deflection members making up each electron beam modulation means M, in lieu of the electrostatic deflection members 12, 12', 12'', electromagnetic deflection members consisting of coils, etc. may be used.

Although the above embodiments are directed to scanning electron microscopes, the present invention can be similarly applied to equipment similar to a scanning electron microscope, which equipment enables to observe images of a specimen by irradiating a plurality of beams of charged particles such as ion beams while processing the specimen with the ions.

As has been described above, the scanning electron microscope or similar equipment of this invention has an advantage that a plurality of specimen images can be displayed extremely efficiently and, also, simultaneously by simple means.

Having now fully described the invention, it will be apparent to one of ordinary skill in the art that many changes and modifications can be made thereto without departing from the spirit or scope of the invention as set forth herein.

What is claimed is:

1. A scanning electron microscope or similar equipment capable of irradiating a plurality of beams of charged particles onto a specimen and displaying simultaneously the plurality of images of the specimen, comprising charged particle beam modulation means capable of modulating the intensities of said beams of charged particles through the deflection of said beams by different frequencies, a detector capable of simultaneously detecting signals obtained by irradiating onto the specimen the plurality of beams of charged particles which have been modulated by the charged particle beam modulation means, demodulation selector means capable of demodulating signals from said detector and selecting each specimen image signal from the plurality of pieces of specimen image information obtained by said beams of charged particles, and display means capable of displaying the plurality of images of the specimen upon receipt of signals from said demodulation selector means.

2. The scanning electron microscope or similar equipment as claimed in claim 1, wherein the plurality of charged particle irradiation systems are disposed with their beam axes extending in parallel to one another so as to irradiate the plurality of beams of charged particles parallelly onto said specimen.

3. The scanning electron microscope or similar equipment as claimed in claim 1, wherein the plurality of charged particle irradiation systems are disposed in such directions that their beam axes intersect on the specimen, thereby allowing to irradiate said beams of charged particles onto said specimen.

4. The scanning electron microscope or similar equipment as claimed in claim 1, wherein said charged particle beam modulation means is provided with the plurality of combinations of oscillators, deflection members connected to their respective oscillators and capable of deflecting their corresponding beams of charged particles and beam limiting members adapted to limit quantity of their corresponding beams of charged particles, the frequencies of the oscillators in said charged particle beam modulation means being different from one another.

5. The scanning electron microscope or similar equipment as claimed in claim 1, wherein said demodulation selector means comprises a filter bank formed of the plurality of band-pass filters whose central frequencies are respectively equivalent to the frequencies adapted to modulate said beams of charged particles, the plurality of rectification circuits adapted to respectively rectify signals from said band-pass filters, and the plurality of low-pass filters adapted to detect only the enclosure components of signals from their corresponding rectification circuits, whereby allowing to demodulate and select the signals from said detector.

6. The scanning electron microscope or similar equipment as claimed in claim 1, wherein said display means comprises the plurality of Braun tubes capable of displaying separately the plurality of specimen images upon receipt of the plurality of pieces of specimen image information from said demodulation selector means.

7. The scanning electron microscope or similar equipment as claimed in claim 1, wherein said display means comprises a change-over switch adapted to receive the plurality of pieces of specimen image information from said demodulation selector means and to switch said pieces of specimen image information sequentially, and a single Braun tube adapted to display the plurality of specimen images on the same picture plane of said Braun tube upon receipt of said pieces of specimen image information which have been sequentially switched by said change-over switch.

* * * * *